United States Patent
Huang

(10) Patent No.: US 11,335,432 B2
(45) Date of Patent: May 17, 2022

(54) METHOD FOR SELECTING BAD COLUMNS IN DATA STORAGE MEDIUM

(71) Applicant: Silicon Motion, Inc., Jhubei (TW)

(72) Inventor: Sheng-Yuan Huang, Jhubei (TW)

(73) Assignee: Silicon Motion, Inc., Jhubei (TW)

(*) Notice: Subject to any disclaimer, the term of this patent is extended or adjusted under 35 U.S.C. 154(b) by 62 days.

(21) Appl. No.: 17/037,795

(22) Filed: Sep. 30, 2020

(65) Prior Publication Data
US 2021/0249099 A1  Aug. 12, 2021

(30) Foreign Application Priority Data
Feb. 12, 2020  (TW) .................... 109104322

(51) Int. Cl.
*G11C 16/06* (2006.01)
*G11C 29/00* (2006.01)
*G11C 16/10* (2006.01)

(52) U.S. Cl.
CPC ............ *G11C 29/808* (2013.01); *G11C 16/10* (2013.01)

(58) Field of Classification Search
CPC ..... G11C 29/808; G11C 16/10; G11C 7/1021; G11C 13/0026
See application file for complete search history.

(56) References Cited

U.S. PATENT DOCUMENTS

| | | | |
|---|---|---|---|
| 10,332,614 B2* | 6/2019 | Houg | G11C 29/76 |
| 2017/0372797 A1* | 12/2017 | Huang | G11C 16/10 |
| 2018/0314428 A1 | 11/2018 | Huang et al. | |
| 2020/0097209 A1* | 3/2020 | Zhou | G06F 11/073 |
| 2021/0034456 A1* | 2/2021 | Kuo | H03M 13/1102 |

* cited by examiner

*Primary Examiner* — Tuan T Nguyen

(57) ABSTRACT

A method for selecting bad columns in a data storage medium is provided. The data storage medium is coupled to a control unit, and the data storage medium includes data blocks, wherein each of the data blocks includes columns. The columns are divided into chunks. The method for selecting bad columns in the data storage medium includes following steps. (a) The control unit calculates a number of bad columns in each of the chunks to sorts the chunks, wherein the bad columns are selected from the columns. (b) The control unit sequentially marks or records the bad columns in each of the chunks with bad column groups, wherein a bad column position and a bad column number in each of the chunks are marked or recorded in each of the bad column groups.

7 Claims, 6 Drawing Sheets

METHOD FOR SELECTING BAD COLUMNS IN DATA STORAGE MEDIUM

FIELD OF THE INVENTION

The present invention relates to a technology of data storage medium, and more particularly to a method for selecting bad columns in data storage medium.

BACKGROUND OF THE INVENTION

In general, a storage device, such as a solid state drive (SSD), a secure digital memory card (SD memory card), or a USB flash drive, is mainly composed of a control unit and a data storage medium. The data storage medium is composed of columns. The columns are used for storing data. It is inevitable that some substandard products are produced as the storage devices are manufactured. Before the substandard products are sold to consumers, bad columns in the substandard products have to be selected and marked or recorded in a bad column table. Thus, according to the bad column table, the control unit can skip the marked bad columns, and the marked bad columns are not accessed, thereby avoiding data access errors.

However, the conventional marking or recording method is to mark or record the bad columns one by one. In fact, there is a limit on a number of marks of the bad columns, for example, up to 254 bad columns can be marked. Therefore, a number of the bad columns is likely to exceed an available number of the marks if the data storage medium is more defective. When the available number of the marks is used up, the remaining unmarked bad columns in the data storage medium may consume a correction capability of the error correcting code (ECC), which may cause that the originally correctable data cannot be properly corrected.

After that, new selecting methods were provided to solve the defects of the conventional methods. A new selecting method is to merge adjacent bad columns to form a bad column group and mark with the bad column group. Therefore, in the condition of the same number of the marks, the number of the marked bad columns can greatly increase by using this selecting method, that is, a hardware limit of the number of the marks is exceeded. This selecting method can mark all the bad columns, however, the storage capacity of the data storage medium may be greatly reduced or even be far below the minimum storage capacity requirement if the bad columns are sparsely distributed rather than densely distributed, thereby affecting the profit of the enterprises.

Therefore, how to provide a method that can exceed the hardware limit of the number of the marked bad columns and also can ensure that the storage capacity of the data storage medium can meet the minimum storage capacity requirement will be the problem focused in the present invention.

SUMMARY OF THE INVENTION

In view of this, an embodiment of the present invention provides a method for selecting bad columns adapted to a data storage medium. The data storage medium is coupled to a control unit. The data storage medium includes a plurality of data blocks. Each of the data blocks includes a plurality of columns. The plurality of columns are divided into a plurality of chunks. The method for selecting bad columns includes steps of: (a) calculating a number of a plurality of bad columns in each of the plurality of chunks to sort the plurality of chunks by the control unit, wherein the plurality of bad columns are selected from the plurality of columns; and (b) sequentially marking or recording the plurality of bad columns in each of the plurality of chunks with a plurality of bad column groups by the control unit, wherein a bad column position and a bad column number in each of the plurality of chunks are marked or recorded in each of the plurality of bad column groups.

In an embodiment of the present invention, after the step (b), the method further includes a step of: (c) calculating a storage capacity of each of the plurality of chunks, summing the storage capacities of the plurality of chunks to obtain a total storage capacity of the plurality of chunks, and determining whether the total storage capacity meets a minimum storage capacity requirement by the control unit.

In an embodiment of the present invention, after the step (c), the method further includes steps of: (d) determining whether at least one bad column in the plurality of chunks is not marked or recorded in the plurality of bad column groups when determining that the total storage capacity does not meet the minimum storage capacity requirement, wherein the at least one bad column is not included in the plurality of bad columns; (e) marking or recording any two of the plurality of bad columns separated by K column/columns in the plurality of bad column groups by the control unit when determining that at least one bad column in the plurality of chunks is not marked or recorded in the plurality of bad column groups, wherein K is a positive integer; (f) calculating the number of the plurality of bad columns and a number of any two of the plurality of bad columns separated by K column/columns in each of the plurality of chunks to sort the plurality of chunks; and (g) sequentially marking or recording the plurality of bad columns and any two of the plurality of bad columns separated by K column/columns in each of the plurality of chunks with the plurality of bad column groups by the control unit, wherein the bad column position and the bad column number in each of the plurality of chunks are marked or recorded in the plurality of bad column groups.

In an embodiment of the present invention, after the step (g), the method further includes steps of: (h) calculating the storage capacity of each of the plurality of chunks, summing the storage capacities of the plurality of chunks to obtain the total storage capacity of the plurality of chunks, and determining whether the total storage capacity meets the minimum storage capacity requirement by the control unit; and (i) adjusting a value of K and performing the step (e) when determining that the total storage capacity does not meet the minimum storage capacity requirement.

Another embodiment of the present invention provides a method for selecting bad columns adapted to a data storage medium. The data storage medium is coupled to a control unit. The data storage medium includes a plurality of data blocks. Each of the data blocks includes a plurality of columns. The plurality of columns are divided into a plurality of chunks. The method for selecting bad columns includes steps of: (a) marking or recording any two of a plurality of bad columns separated by K column/columns in a plurality of bad column groups by the control unit, wherein the plurality of bad columns are selected from the plurality of columns, and K is a positive integer; and (b) calculating a number of the plurality of bad columns and a number of any two of the plurality of bad columns separated by K column/columns in each of the plurality of chunks to sort the plurality of chunks by the control unit.

In another embodiment of the present invention, after the step (b), the method further includes a step of: (c) sequentially marking or recording the plurality of bad columns and any two of the plurality of bad columns separated by K column/columns in each of the plurality of chunks with the plurality of bad column groups by the control unit, calculating a storage capacity of each of the plurality of chunks, summing the storage capacities of the plurality of chunks to obtain a total storage capacity and recording the total storage capacity in a total storage capacity record table by the control unit, wherein a bad column position and a bad column number in each of the plurality of chunks are marked or recorded in each of the plurality of bad column groups.

In another embodiment of the present invention, after the step (c), the method further includes steps of: (d) determining whether a number of the plurality of bad column groups is less than or equal to a bad column group upper limit value; (e) adjusting a value of K and performing the step (a) when determining that the number of the plurality of bad column groups is not less than or equal to the bad column group upper limit value; and (f) selecting a largest total storage capacity from the total storage capacity record table when determining that the number of the plurality of bad column groups is less than or equal to the bad column group upper limit value.

In the method for selecting bad columns in a data storage medium according to the embodiments of the present invention, the chunks are sorted according to the number of the bad columns or the number of the bad column groups in each chunk. The bad columns and the bad column groups in each chunk are sequentially marked according to the sorting result until an available number of marks are used up. Finally, the largest total storage capacity is selected to achieve a purpose of optimizing the total storage capacity. In addition, the time of the method for selecting bad columns can be reduced by setting the minimum storage capacity requirement.

The above description is only an overview of the technical solution of the present invention. In order to understand the technical means of the present invention more clearly, it can be implemented according to the content of the specification. In order to make the above and other objects, features, and advantages of the present invention more comprehensible, embodiments are described below in detail with reference to the accompanying drawings, as follows.

DETAILED DESCRIPTION OF PREFERRED EMBODIMENTS

Figure 1:
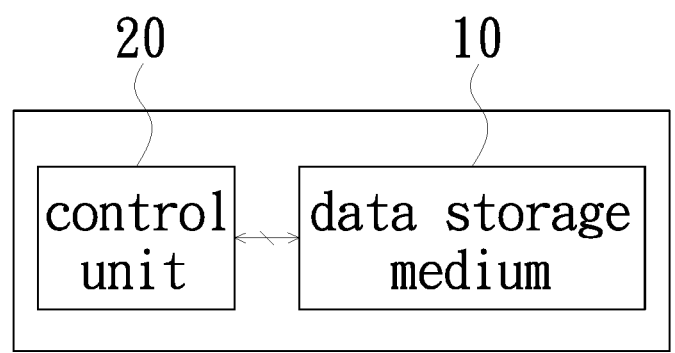
FIG. 1 is a schematic diagram of a data storage device.

FIG. 1 is a schematic diagram of a data storage device. As shown in FIG. 1, a data storage device includes a data storage medium 10 and a control unit 20. The control unit 20 is coupled to the data storage medium 10 to access data from the data storage medium 10.

Figure 2:
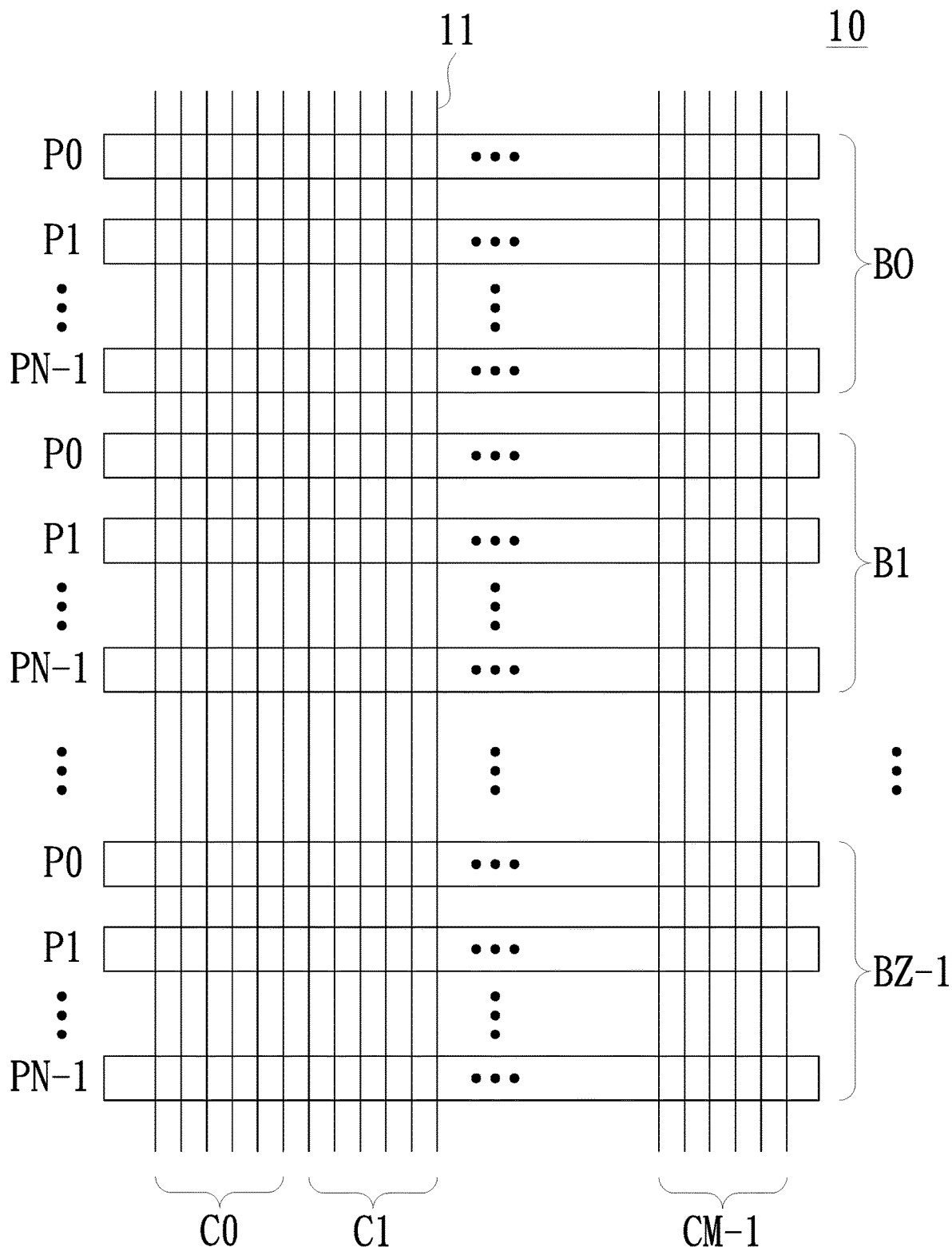
FIG. 2 is a schematic diagram of a data storage medium.

FIG. 2 is a schematic diagram of a data storage medium. As shown in FIG. 2, the data storage medium 10 includes a plurality of physical blocks (hereinafter referred to as data blocks, as indicated by the reference signs B0 to BZ-1). Each of the plurality of data blocks B0 to BZ-1 includes a plurality of columns 11. The columns 11 arranged in the same row constitute a page (as indicated by the reference signs P0 to PN-1). In addition, the columns 11 can be divided into M chunks (as indicated by the reference signs C0 to CM-1) according to a user's need, and each of the chunks C0 to CM-1 contains Y columns. A total number of the columns 11 is preferably greater than or equal to the number of the M*Y columns required by the M chunks. The abovementioned Z, N, M, and Y are all positive integers. Moreover, each of the chunks C0 to CM-1 can be partitioned into a data region and an error correction region. The data region is used for storing data or user data. The error correction region is used for storing parity code. The parity code is used for correcting the error bits of the data in the data region. In the present embodiment, the data storage medium 10 can be a non-volatile memory, such as a flash memory, MRAM (Magnetoresistive RAM), FRAM (Ferroelectric RAM), capable of storing data for a long time.

The following description is about a method for selecting bad columns 12 (hereinafter referred to as a selecting method) of the present invention, which is used for selecting the bad columns 12 in the data storage medium 10. In order to improve the efficiency of performing the selecting method, preferably, a minimum storage capacity requirement of the chunks C0 to CM-1 is set, for example, for 70% of a total storage capacity of the chunks C0 to CM-1. Besides, one of the data blocks B0 to BZ-1 is randomly selected and used as a sample data block to perform the selecting method, instead of using all the blocks B0 to BZ-1. In addition, in order to simplify the description, the embodiment merely uses ten as the number of marks of the bad columns, instead of using all the numbers of the marks, but it is not limited thereto. The data block B0 is taken as the sample data block for the following description. For example, each of the data pages P0 to PN-1 in the data block B0 can be partitioned into 4 chunks. A size of each of the chunks can be 1150 Bytes, wherein a size of the data region can be 1024 Bytes, and a size of the error correction region can be 126 Bytes. In other words, a size of each of the data pages P0 to PN-1 is 4600 Bytes. At this moment, the minimum storage capacity requirement of each of the data pages P0 to PN-1 is preferably 3220 Bytes.

Figure 3:
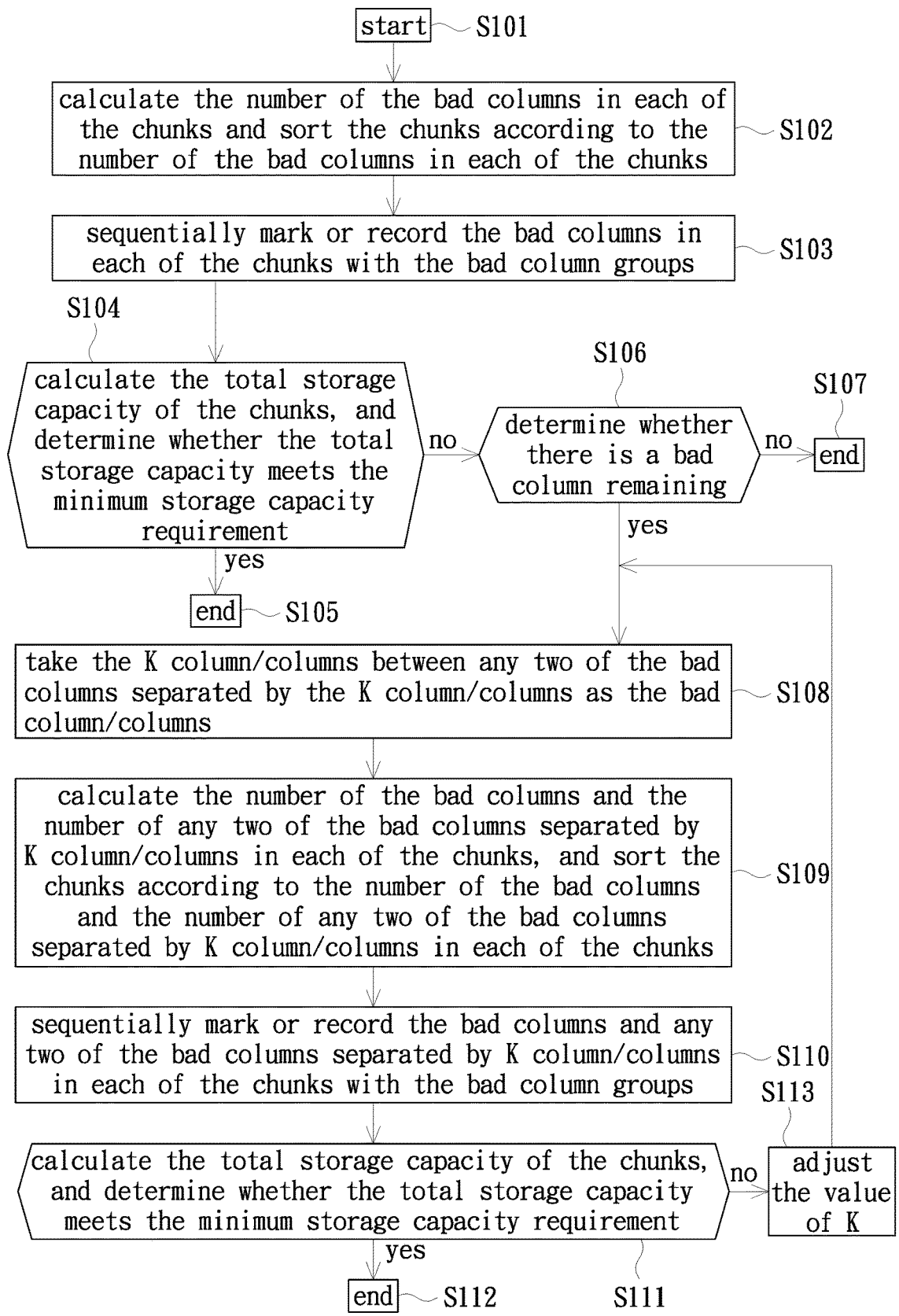
FIG. 3 is a schematic flow diagram of a method for selecting bad columns in a data storage medium according to a first embodiment of the present invention.

FIG. 3 is a schematic flow diagram of a method for selecting bad columns in a data storage medium according to a first embodiment of the present invention. After starting the selecting method (as shown in step S101), the control unit 20 calculates a number of the bad columns 12 in each of the chunks C0 to C3 and sorts the chunks C0 to C3 according to the number of the bad columns 12 in each of the chunks C0 to C3. Preferably, the chunks C0 to C3 are sorted according to the number of the bad columns 12 in each of the chunks C0 to C3, wherein the bad columns 12 are selected from the columns 11 (as shown in step S102). As for the method of determining whether a column 11 is a bad column 12 belongs to the scope of the conventional technology, no redundant detail is to be given herein.

Figure 4A:
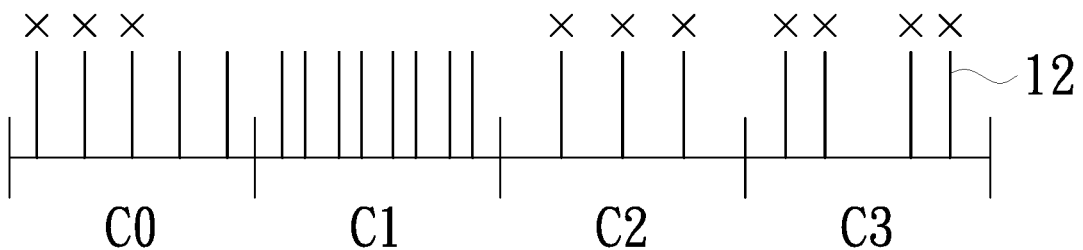
FIG. 4A is a schematic diagram of a first round of marking the bad columns according to the first embodiment of the present invention.

FIG. 4A is a schematic diagram of a first round of marking the bad columns according to the first embodiment of the present invention. In FIG. 4A, only the bad columns 12 are shown, and available columns 11 are not shown. Crosses (i.e., the reference signs x) above the bad columns 12 indicates that the bad columns 12 is marked or recorded. The chunk C0 is found to have five bad columns 12, and any two of the bad columns 12 in the chunk C0 are, for example, separated by three columns 11. In other words, a number of available columns 11 for the chunk C0 is at most Y-5. The chunk C1 is found to have eight bad columns 12, and any two of the bad columns 12 in the chunk C1 are, for example, separated by one column 11. In other words, a number of available columns 11 for the chunk C1 is at most Y-8. The chunk C2 is found to have three bad columns 12, and any two of the bad columns 12 in the chunk C2 are, for example, separated by four columns 11. In other words, a number of available columns 11 for the chunk C2 is at most Y-3. The chunk C3 is found to have four bad columns 12, and any two of the bad columns 12 in the chunk C3 are, for example, separated by two columns 11. In other words, a number of available columns 11 for the chunk C3 is at most Y-4. If the order of the chunks C0 to C3 is sorted according to the numbers of bad columns 12, the sorting result is the chunks C2, C3, C0, and C1.

According to the sorting result, the control unit 20 sequentially marks or records the bad columns 12 in each of the chunks C0 to C3 with a plurality of bad column groups. Positions of the bad columns 12 and a number of the bad columns 12 in each of the chunks C0 to C3 are marked or recorded in each of the bad column groups (as shown in step S103). At this moment, only one bad column 12 is marked or recorded in each bad column group. First, the control unit 20 marks or records the three bad columns 12 in the chunk C2 in the bad column groups. Next, the control unit 20 marks or records the four bad columns 12 in the chunk C3 in the bad column groups. Next, the control unit 20 marks or records three of the five bad columns 12 in the chunk C0 in the bad column groups. At this moment, only the bad columns 12 in chunks C2 and C3 are all marked or recorded, only a part of the bad columns 12 of the chunk C0 are marked or recorded, and all the bad columns 12 in the chunk C1 are not marked or recorded. Finally, the results are marked or recorded in the bad column groups. Therefore, the control unit 20 can avoid accessing the marked bad columns 12 according to the bad column groups, thereby avoiding the condition of data access errors.

Then, the control unit 20 calculates a storage capacity of each of the chunks C0 to C3 according to the available columns 11 in each of the chunks C0 to C3, sums the storage capacities of the chunks C0 to C3 to obtain a total storage capacity of the chunks C0 to C3, and determines whether the total storage capacity meets the minimum storage capacity requirement (as shown in step S104). When it is determined that the total storage capacity meets the minimum storage capacity requirement, a process of the selecting method is ended (as shown in step S105). As for the method of calculating the storage capacity of the chunks belongs to the scope of the conventional technology, no redundant detail is to be given herein. After performing the first round of the selecting method, according to a condition of marking or recording the bad columns 12, the remaining available chunks in each of the data pages P0 to PN-1 are only the chunk C2, the chunk C3, and a part of the chunk C0, wherein about 2.6 chunks are remaining available. Thus, the available total storage capacity of the chunks C0 to C3 is about 2990 Bytes. However, this total storage capacity does not meet the minimum storage capacity requirement of 3220 Bytes.

On the other hand, when it is determined that the total storage capacity does not meet the minimum storage capacity requirement, it is then determined that whether there is a remaining bad column 12 in the chunks C0 to C3. In other words, it is to determine whether an at least one bad column 12 in the chunks C0 to C3 is not marked or recorded in the bad column groups, wherein the at least one bad column 12 is not included in the bad columns 12 (as shown in step S106). For example, some bad columns 12 in the chunk C1 are not marked or recorded in the bad column groups. When it is determined that all the bad columns 12 in the chunks C0 to C3 are marked or recorded in the bad column groups, the process of the selecting method is ended (as shown in step S107).

Figure 4B:
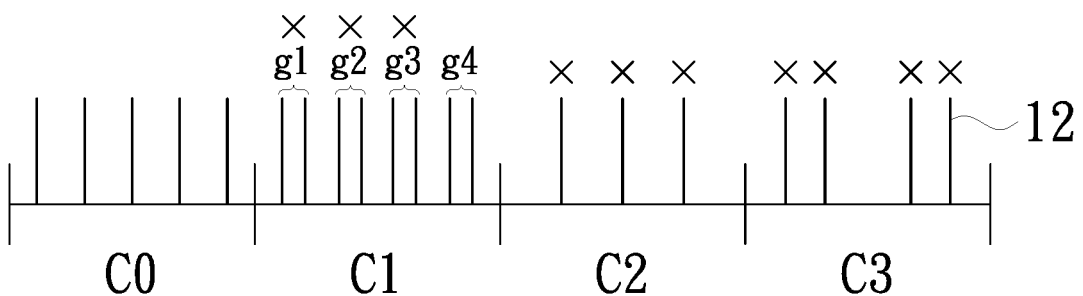
FIG. 4B is a schematic diagram of a second round of marking the bad columns according to the first embodiment of the present invention.

On the contrary, when it is determined that at least one bad column 12 in the chunks C0 to C3 is not marked or recorded in the bad column groups, the control unit 20 takes K column/columns 11 between any two of the bad columns 12 separated by the K column/columns 11 as the bad column/columns 12, and records these bad columns 12 in the same bad column group, wherein K is a positive integer (as shown in step S108). In this embodiment, an initial value of K is 1, but not limited thereto. Please refer to FIG. 4B. FIG. 4B is a schematic diagram of a second round of marking the bad columns according to the first embodiment of the present invention. In the first round of marking the bad columns 12, since the number of marks is limited to ten bad columns 12, all the eight bad columns 12 in the chunk C1 are not marked (as shown in FIG. 4A). Since there are four groups of two adjacent bad columns 12 in the chunk C1 and any two of the bad columns 12 are separated by, for example, one column 11, the control unit 20 can record each of the two adjacent bad columns 12 and the one column 11 between the two adjacent bad columns 12 in the same bad column group (shown as the reference signs g1 to g4). As for the chunk C0, the chunk C2, and the chunk C3, they are as described above, so no redundant detail is to be given herein.

Next, the control unit 20 calculates the number of the bad columns 12 and the number of any two of the bad columns 12 separated by K column/columns 11 in each of the chunks C0 to C3, and sorts the chunks C0 to C3 according to the number of the bad columns 12 and the number of any two of the bad columns 12 separated by K column/columns 11 in each of the chunks C0 to C3. The sorting is preferably performed according to the number of the bad columns 12 (as shown in step S109). If the order of the chunks C0 to C3 is sorted according to the number of the bad columns 12, the sorting result is the chunks C2, C3, C1, and C0.

Then, according to the sorting result, the control unit 20 sequentially marks or records the bad columns 12 and any two of the bad columns 12 separated by K column/columns 11 in each of the chunks C0 to C3 with the bad column groups. The positions of the bad columns 12 and the number of the bad columns 12 in each of the chunks C0 to C3 are marked or recorded in each of the bad column groups (as shown in step S110). At this moment, one bad column 12 or several adjacent bad columns 12 can be marked or recorded in each bad column group. Not only starting positions of the adjacent bad columns 12 are recorded, the number of the adjacent bad columns 12 is also recorded. First, the control unit 20 marks or records the three bad columns 12 of the chunk C2 in the bad column groups. Next, the control unit 20 marks or records the four bad columns 12 of the chunk C3 in the bad column groups. Next, the control unit 20 marks or records three of the four groups g1 to g4 of the bad columns 12 of the chunk C1 in the bad column groups. Finally, the results are marked or recorded in the bad column groups. At this moment, only the bad columns 12 in the chunks C2 and C3 are all marked or recorded, most of the bad columns 12 in chunk C1 are marked or recorded, and all the bad columns 12 in the chunk C0 are not marked or recorded.

Then, the control unit 20 calculates the storage capacity of each of the chunks C0 to C3 according to the available columns 11 in each of the chunks C0 to C3, and sums the storage capacities to obtain the total storage capacity of the chunks C0 to C3, and determines whether the total storage capacity meets the minimum storage capacity requirement (as shown in step S111). When it is determined that the total storage capacity meets the minimum storage capacity requirement, the process of the selecting method is ended (as shown in step S112). After performing a second round of the selecting method, according to a condition of marking or recording the bad columns 12 and the bad column groups, the available storage capacity of each of the pages P0 to PN-1 is the sum of the storage capacities of the chunks C2, C3 and most of the chunk C1, wherein about 2.75 chunks are remaining available. Thus, the available total storage capacity of the chunks C0 to C3 is about 3162 Bytes. Compared with the first round, although the total storage capacity is increased by 172 Bytes, it still does not meet the minimum storage capacity requirement of 3220 Bytes. When it is determined that the total storage capacity does not meet the minimum storage capacity requirement, the value of K is adjusted. For example, K is adjusted to 2. Then, the steps S108 to S113 are performed again. The whole process can be ended (as shown in step S112) upon the total storage capacity of the chunks C0 to C3 meets the minimum storage capacity requirement (as shown in step S111).

Figure 4C:
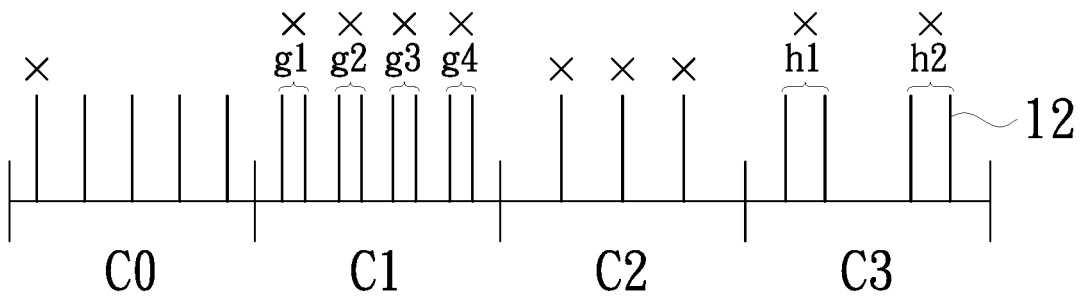
FIG. 4C is a schematic diagram of a third round of marking the bad columns according to the first embodiment of the present invention.

The process related to the steps S108 to S111 have already been described above, no redundant detail is to be given herein. Please refer to FIG. 4C. FIG. 4C is a schematic diagram of a third round of marking the bad columns according to the first embodiment of the present invention. In step S108, since there are two groups of the two adjacent bad columns 12 in the chunk C3, and any two of the bad columns 12 are separated by, for example, two columns 11, the control unit 20 can records each of the two adjacent bad columns 12 and the two columns 11 between the two adjacent bad columns 12 in the same bad column group (as shown by the preference signs h1 to h4), wherein the two columns 11 between the two adjacent bad columns 12 are taken as the bad columns 12. If the order of the chunks C0 to C3 is sorted according to the numbers of bad columns 12, the sorting result is the chunks C3, C2, C1, and C0 (as shown in step S109). According to the sorting result, first, the two groups h1 and h2 of the bad columns 12 in the chunk C3 are marked or recorded by the control unit 20. Next, the three bad columns 12 in the chunk C2 are marked or recorded. Next, the four groups g1 to g4 of the bad columns 12 in the chunk C1 are marked or recorded. Next, one of the five bad columns 12 in the chunk C0 is marked or recorded. Finally, the results are marked or recorded in the bad column groups.

At this moment, all the bad columns 12 in the chunks C1 to C3 are marked or recorded, and only one of the bad columns 12 in the chunk C0 is marked or recorded (as shown in step S110). After performing a third round of the selecting method, according to a condition of marking or recording the bad columns 12 and the bad column groups, the available storage capacity of each of the pages P0 to PN-1 is the sum of the storage capacities of the chunks C1, C2, and C3 and part of the chunk C0, wherein about 3.2 chunks are remaining available. Thus, the available total storage capacity of the chunks C0 to C3 is about 3680 Bytes. Compared with the second round, the total storage capacity is increased by 518 Bytes and meets the minimum storage capacity requirement of 3220 Bytes (as shown in step S111). Thus, the process of the selecting method can be ended (as shown in step S112). In view of this, the selecting method performed in the first embodiment of the present invention combines the steps of sorting the chunks and marking the groups. Hence, under a limit of the same number of marks, more bad columns can be marked, and an optimized marking or recording way can be efficiently found to meet the minimum storage capacity requirement and thus a purpose of the present invention is achieved.

In a second embodiment of the present invention, the control unit 20 can sequentially mark or record the bad columns 12 or the bad column groups in each of the chunks C0 to C3 according to the number order of the chunks C0 to C3 until the available number of marks are used up. For example, in the first round of the selecting method, first, the control unit 20 can mark or record the five bad columns 12 in the chunk C0. Next, the control unit 20 marks or records five of the bad columns 12 in the block C1. Then, the results are marked or recorded in bad column groups. Finally, the available total storage capacity of the chunks C0 to C3 is calculated, and it is determined whether the total storage capacity meets the minimum storage capacity requirement. When it is determined that the total storage capacity meets the minimum storage capacity requirement, the whole process can be ended. On the contrary, when it is determined that the total storage capacity does not meet the minimum storage capacity requirement, it is then determined that whether there is a remaining bad column 12 in the chunks C0 to C3. As for the next steps, they are similar to those described in the first embodiment of the present invention. No redundant detail is to be given herein. It is noted that the second embodiment of the present invention is similar to the first embodiment of the present invention. The main difference is whether to sort the chunks C0 to C3 according to the number of the bad columns 12 in each of the chunks C0 to C3 before the bad columns 12 or the bad column groups of each of the chunks C0 to C3 are marked or recorded. However, by using the selecting method of the second embodiment of the present invention, the available columns 11 and the total storage capacity may be less than those of the first embodiment of the present invention. Also, the performing efficiency may also be worse than that of the first embodiment of the present invention.

What is explained hereinafter is a method for selecting bad columns in a data storage medium according to a third embodiment of the present invention (hereinafter referred to as a selecting method). In order to simplify the description, the third embodiment uses fourteen as the number of marks of the bad columns 12 to be a bad column group upper limit value, instead of using all the number of marks, but the present invention is not limited thereto. Besides, as for some steps and illustrations of the third embodiment of the present invention have been described in detail in the aforementioned embodiments, no redundant detail is to be given herein.

Figure 5:
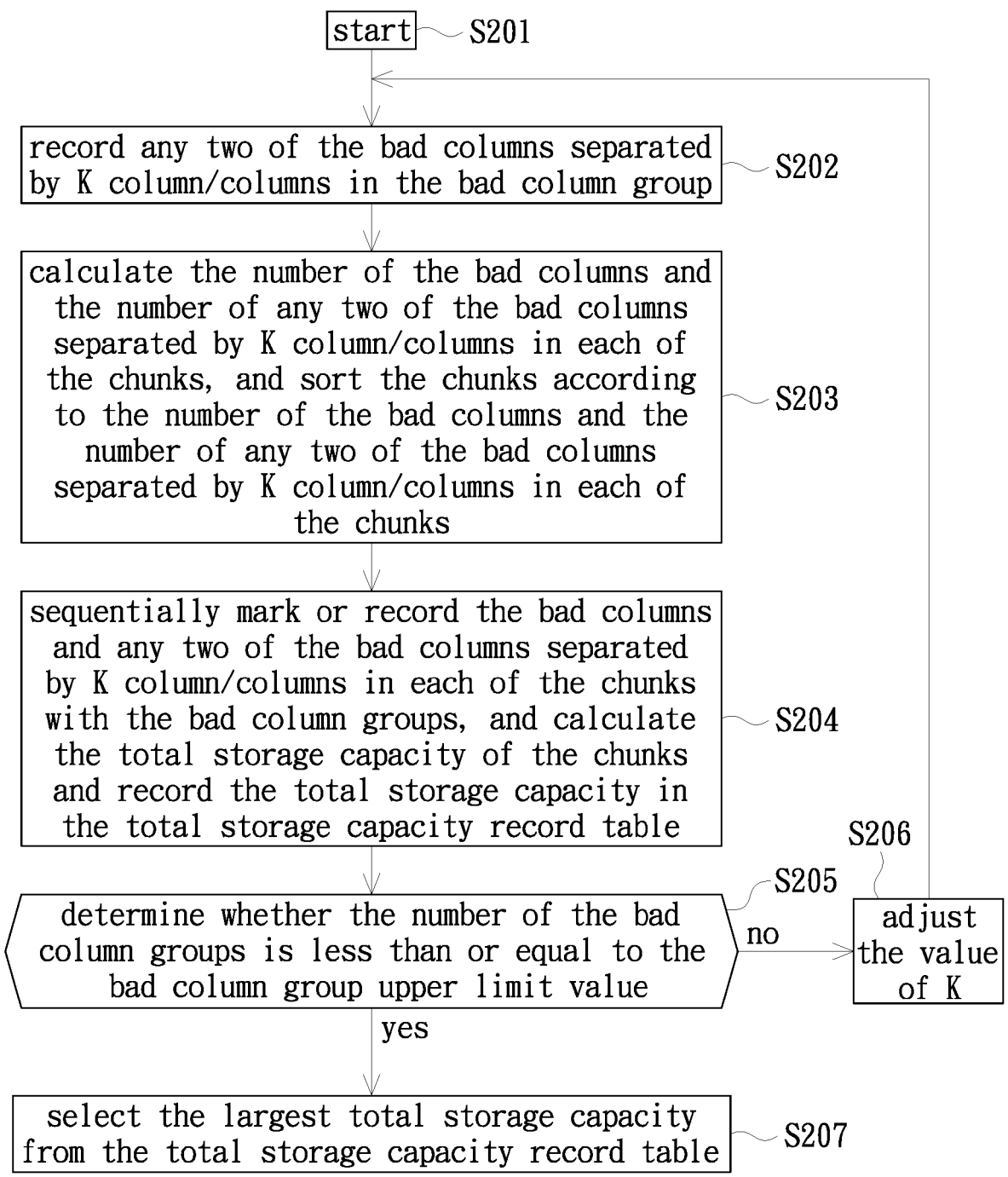
FIG. 5 is a schematic flow diagram of a method for selecting bad columns in a data storage medium according to a third embodiment of the present invention.
Figure 6A:
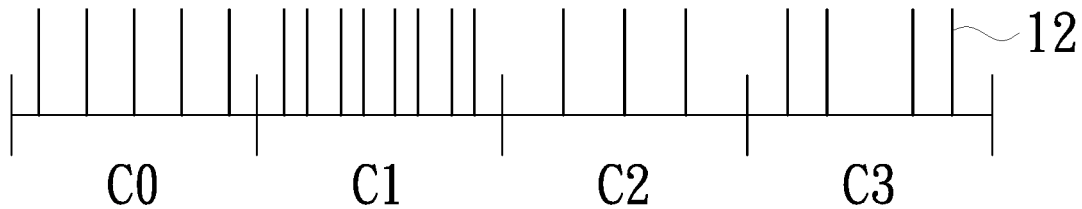
FIG. 6A is a schematic diagram of distribution of bad columns according to the third embodiment of the present invention.

FIG. 5 is a schematic flow diagram of the method for selecting bad columns in a data storage medium according to the third embodiment of the present invention. FIG. 6A is a schematic diagram of the distribution of the bad columns according to the third embodiment of the present invention. In FIG. 6A, the number of bad columns 12 is twenty, which exceeds the bad column group upper limit value. Thus, it is required to perform the selecting method of the present invention (as shown in step S201) to reduce the number of the groups of the bad columns 12 and obtain a maximum total storage capacity.

Figure 6B:
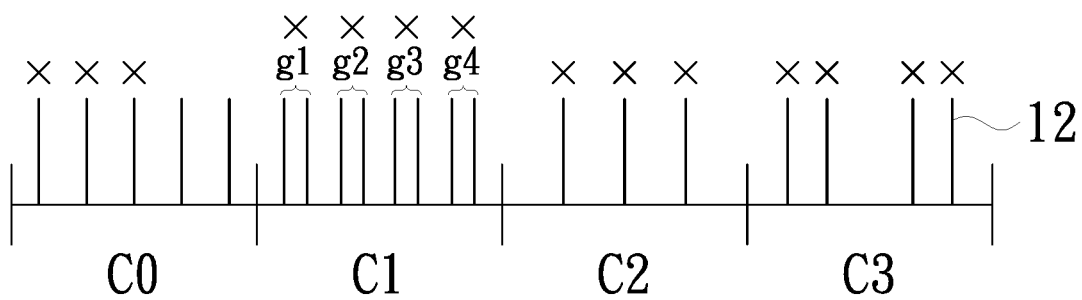
FIG. 6B is a schematic diagram of a first round of marking bad columns according to the third embodiment of the present invention.

First, the control unit 20 takes the columns 11 between any two bad columns 12 separated by K column/columns 11 as the bad columns 12, and records the bad columns 12 in the same bad column group, where K is a positive integer (as shown in step S202). In this embodiment, the initial value of K is 1, but not limited thereto. Please refer to FIG. 6B. FIG. 6B is a schematic diagram of a first round of marking the bad columns according to the third embodiment of the present invention. Since there are four groups of two adjacent bad columns 12 in the chunk C1 and any two of the bad columns 12 are separated by one column 11, the control unit 20 can record two adjacent bad columns 12 and the one column 11 between the two adjacent bad columns 12 in the same bad column group (shown as the reference signs g1 to g4), wherein the one column 11 between the two adjacent bad columns 12 is taken as a bad column 12. As for the chunk C0, the chunk C2, and the chunk C3, they are as described in the first embodiment, so no redundant detail is to be given herein.

Next, the control unit 20 calculates a number of the bad columns 12 and a number of any two bad columns 12 separated by K column/columns 11 in each of the chunks C0 to C3, and sort the chunks C0 to C3 according to the number of the bad columns 12 and the number of any two bad columns 12 separated by K column/columns 11 in each chunks C0 to C3. The sorting is preferably performed according to the number of the bad columns 12 (as shown in step S203). If the order of the chunks C0 to C3 is sorted according to the number of the bad columns 12, the sorting result can be the chunks C2, C3, C1, and C0, or the chunks C2, C1, C3, and C0. If there are multiple sorting results, the control unit 20 may randomly select one of the sorting results as the final sorting result, such as selecting the chunks C2, C3, C1, and C0, but the selecting method is not limited thereto.

Then, according to the sorting result, the control unit 20 sequentially marks or records the bad columns 12 and any two bad columns 12 separated by K column/columns 11 in each of the chunks C0 to C3 with the bad column groups. Positions of the bad columns 12 and the number of the bad columns 12 in each of the chunks C0 to C3 are marked or recorded in each of the bad column groups. The control unit 20 calculates a total storage capacity of the chunks C0 to C3 and records the total storage capacity in a total storage capacity record table (as shown in step S204). At this moment, each bad column group can mark or record one bad column 12 or several adjacent bad columns 12, where not only a start position of the adjacent bad columns 12 is recorded, but also a number of the adjacent bad columns 12 is recorded. First, the control unit 20 marks or records the three bad columns 12 in the chunk C2 in the bad column groups. Next, the four bad columns 12 in the chunk C3 are marked or recorded in the bad column groups. Next, the four groups g1 to g4 of the bad columns 12 in the chunk C1 are marked or recorded. Next, three of the five bad columns 12 in the chunk C0 are marked or recorded. Then, the results are marked or recorded in the bad column groups. After that, the control unit 20 calculates and records the storage capacity of each of the chunks C0 to C3 according to the available columns 11 of each of the chunks C0 to C3, and sums the storage capacities up to obtain the total storage capacity of the chunks C0 to C3, and record the total storage capacity in the total storage capacity record table. After performing the first round of the selecting method, according to a condition of marking or recording the bad columns 12 and the bad column 12 groups, the available storage capacity of each of the pages P0 to PN-1 is the sum of the storage capacities of the chunks C1 to C3 and a part of the chunk C0, wherein about 3.6 chunks are remaining available. Therefore, the available total storage capacity of the chunks C0 to C3 is about 4140 Bytes.

Then, the control unit 20 determines whether the number of the bad column groups is less than or equal to the bad column group upper limit value (as shown in step S205). After performing the first round of the selecting method, although the number of bad column groups was reduced to sixteen, the number is still greater than the bad column group upper limit value, so the value of K needs to be adjusted, for example, K is adjusted to 2 (as shown in step S206). Then, the steps S202 to S204 are performed again until the number of the bad column groups meets the bad column group upper limit value (as shown in step 205).

Figure 6C:
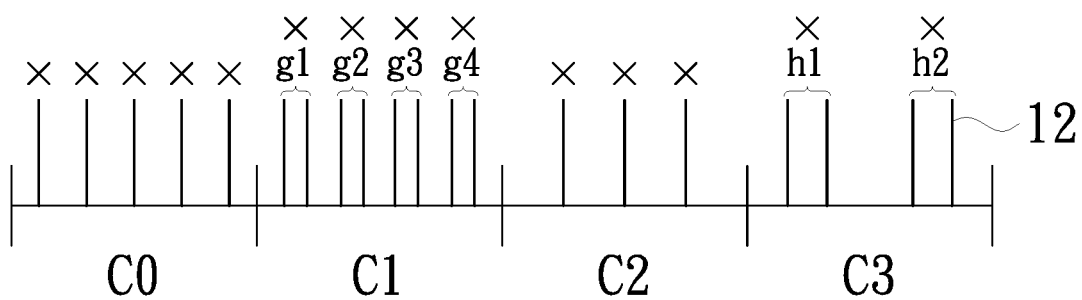
FIG. 6C is a schematic diagram of a second round of marking bad columns according to the third embodiment of the present invention.

Please refer to FIG. 6C. FIG. 6C is a schematic diagram of a second round of marking the bad columns according to the third embodiment of the present invention. In step S202, since there are two groups of two adjacent bad columns 12 in the chunk C3, and any two of the bad columns 12 are separated by two columns 11, the control unit 20 can records the two adjacent bad columns 12 and the two columns 11 between the two adjacent bad columns 12 in the same bad column group (as shown by the preference signs h1 to h4), wherein the two columns 11 between the two adjacent bad columns 12 are taken as bad columns 12. If the order of the chunks C0 to C3 is sorted according to the numbers of bad columns 12, the sorting result is the chunks C3, C2, C1, and C0 (as shown in step S203). According to the sorting result, first, the control unit 20 marks or records the two groups h1 and h2 of the bad columns 12 in the chunk C3. Next, the control unit 20 marks or records the three bad columns 12 in the chunk C2. Next, the control unit 20 marks or records the four groups g1 to g4 of the bad columns 12 in the chunk C1. Next, the control unit 20 marks or records the five bad columns 12 in the chunk C0. Then, the results are marked or recorded in the bad column groups. After that, the control unit 20 calculates and records the storage capacity of each of the chunks C0 to C3 according to the available columns 11 of each of the chunks C0 to C3, and sums the storage capacities to get the total storage capacity of the chunks C0 to C3 and record the total storage capacity in the total storage capacity record table. After performing the second round of the selecting method, according to a condition of marking or recording the bad columns 12 and the bad column groups, the available storage capacity of each of the pages P0 to PN-1 is the sum of the storage capacities of the chunks C0 to C3, wherein about four chunks are remaining available. Therefore, the available total storage capacity of the chunks C0 to C3 is about 4600 Bytes.

Then, the control unit 20 determines whether the number of the bad column groups is less than or equal to the bad column group upper limit value (as shown in the step S205).

After performing the second round of the selecting method, the number of the bad column groups is reduced to fourteen, which is exactly equal to the bad column group upper limit value, so there is no need to adjust the value of K. Then, the control unit 20 selects the largest total storage capacity from the total storage capacities of the chunks C0 to C3 recorded in the total storage capacity record table, and take the positions of the bad columns 12 and the number of the bad columns 12 in the chunks C0 to C3 recorded in the bad column groups in this round as an initial value for the data storage medium 10. After that, the process of the selecting method is ended (as shown in step S207). Because the total storage capacity (4600 Bytes) of the chunks C0 to C3 in the second round of the selecting method is larger than the total storage capacity (4140 Bytes) of the large blocks C0 to C3 in the first round of the selecting method, the control unit 20 will use the relevant marks or records of the second round of the selecting method as the initial value for the data storage medium 10 to achieve the purpose of optimizing the total storage capacity of the data storage medium 10.

In summary, the methods for selecting bad columns in a data storage medium provided in the embodiments of the present invention combines the steps of sorting the chunks and marking the groups. Hence, more bad columns can be marked under the limit of the same number of marks, and an optimized marking or recording way can be efficiently found. The largest total storage capacity is selected to achieve the purpose of optimizing the total storage capacity. In addition, the time of the selecting method can be reduced by setting the minimum storage capacity requirement to meet the minimum storage capacity requirement, such that the purpose of the present invention is achieved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for selecting bad columns, adapted to a data storage medium, wherein the data storage medium is coupled to a control unit, the data storage medium includes a plurality of data blocks, each of the data blocks includes a plurality of columns, the columns are divided into a plurality of chunks, the method for selecting bad columns comprises steps of:
   (a) calculating a number of a plurality of bad columns in each of the chunks to sort the chunks by the control unit, wherein the bad columns are selected from the columns; and
   (b) sequentially marking or recording the bad columns in each of the chunks with a plurality of bad column groups by the control unit, wherein a bad column position and a bad column number in each of the chunks are marked or recorded in each of the bad column groups.

2. The method for selecting bad columns according to claim 1, wherein after the step (b), the method for selecting bad columns further comprises a step of:
   (c) calculating a storage capacity of each of the chunks, summing the storage capacities of the chunks to obtain a total storage capacity of the chunks, and determining whether the total storage capacity meets a minimum storage capacity requirement by the control unit.

3. The method for selecting bad columns according to claim 2, wherein after the step (c), the method for selecting bad columns further comprises steps of:
   (d) determining whether at least one bad column in the chunks is not marked or recorded in the bad column groups when determining that the total storage capacity does not meet the minimum storage capacity requirement, wherein the at least one bad column is not included in the bad columns;
   (e) marking or recording any two of the bad columns separated by K column/columns in the bad column groups by the control unit when determining that at least one bad column in the chunks is not marked or recorded in the bad column groups, wherein K is a positive integer;
   (f) calculating the number of the bad columns and a number of any two of the bad columns separated by K column/columns in each of the chunks to sort the chunks; and
   (g) sequentially marking or recording the bad columns and any two of the bad columns separated by K column/columns in each of the chunks with the bad column groups by the control unit, wherein the bad column position and the bad column number in each of the chunks are marked or recorded in the bad column groups.

4. The method for selecting bad columns according to claim 3, wherein after the step (g), the method for selecting bad columns further comprises steps of:
   (h) calculating the storage capacity of each of the chunks, summing the storage capacities of the chunks to obtain the total storage capacity of the chunks, and determining whether the total storage capacity meets the minimum storage capacity requirement by the control unit; and
   (i) adjusting a value of K and performing the step (e) when determining that the total storage capacity does not meet the minimum storage capacity requirement.

5. A method for selecting bad columns, adapted to a data storage medium, wherein the data storage medium is coupled to a control unit, the data storage medium includes a plurality of data blocks, each of the data blocks includes a plurality of columns, the columns are divided into a plurality of chunks, the method for selecting bad columns comprises steps of:
   (a) marking or recording any two of a plurality of bad columns separated by K column/columns in a plurality of bad column groups by the control unit, wherein the bad columns are selected from the columns, and K is a positive integer; and
   (b) calculating a number of the bad columns and a number of any two of the bad columns separated by K column/columns in each of the chunks to sort the chunks by the control unit.

6. The method for selecting bad columns according to claim 5, wherein after the step (b), the method for selecting bad columns further comprises steps of:
   (c) sequentially marking or recording the bad columns and any two of the bad columns separated by K column/columns in each of the chunks with the bad column groups by the control unit, calculating a storage capacity of each of the chunks, summing the storage capacities of the chunks to obtain a total storage capacity and recording the total storage capacity in a total storage capacity record table by the control unit, wherein a bad column position and a bad column number in each of the chunks are marked or recorded in each of the bad column groups.

7. The method for selecting bad columns according to claim 6, wherein after the step (c), the method for selecting bad columns further comprises steps of:
  (d) determining whether a number of the bad column groups is less than or equal to a bad column group upper limit value;
  (e) adjusting a value of K and performing the step (a) when determining that the number of the bad column groups is not less than or equal to the bad column group upper limit value; and
  (f) selecting a largest total storage capacity from the total storage capacity record table when determining that the number of the bad column groups is less than or equal to the bad column group upper limit value.

* * * * *